United States Patent
Kamiya

(10) Patent No.: US 10,388,553 B2
(45) Date of Patent: Aug. 20, 2019

(54) SUBSTRATE PROCESSING SYSTEM

(71) Applicant: ASM IP Holding B.V., Almere (NL)

(72) Inventor: Tatsuo Kamiya, Tsubame (JP)

(73) Assignee: ASM IP Holding B.V., Almere (NL)

( * ) Notice: Subject to any disclaimer, the term of this patent is extended or adjusted under 35 U.S.C. 154(b) by 679 days.

(21) Appl. No.: 14/980,300

(22) Filed: Dec. 28, 2015

(65) Prior Publication Data
US 2017/0186633 A1   Jun. 29, 2017

(51) Int. Cl.
| | | |
|---|---|---|
| *H01L 21/673* | (2006.01) | |
| *F16K 31/122* | (2006.01) | |
| *F16K 3/18* | (2006.01) | |
| *F16K 51/02* | (2006.01) | |
| *H01L 21/677* | (2006.01) | |
| *H01L 21/67* | (2006.01) | |

(52) U.S. Cl.
CPC ........ *H01L 21/67373* (2013.01); *F16K 3/188* (2013.01); *F16K 31/1225* (2013.01); *F16K 51/02* (2013.01); *H01L 21/67017* (2013.01); *H01L 21/6719* (2013.01); *H01L 21/67253* (2013.01); *H01L 21/67739* (2013.01); *H01L 21/67742* (2013.01)

(58) Field of Classification Search
CPC .......... F16K 51/02; F16K 31/122; F16K 3/18; F16K 3/10; F16K 31/1225; H01L 21/67373; H01L 21/6774; H01L 21/67739; C23C 14/568
See application file for complete search history.

(56) References Cited

U.S. PATENT DOCUMENTS

| | | | | | |
|---|---|---|---|---|---|
| 5,455,082 | A | * | 10/1995 | Saito | C23C 14/566 427/248.1 |
| 6,343,239 | B1 | * | 1/2002 | Toda | H01L 21/67126 700/121 |
| 2004/0262254 | A1 | * | 12/2004 | Ozawa | C23C 16/54 216/2 |
| 2006/0033065 | A1 | * | 2/2006 | Duelli | F16K 3/0254 251/193 |
| 2007/0231246 | A1 | * | 10/2007 | Hwang | B01J 4/002 423/460 |
| 2010/0206845 | A1 | * | 8/2010 | Hashimoto | H01J 37/3244 216/67 |

FOREIGN PATENT DOCUMENTS

| | | |
|---|---|---|
| JP | 2003140703 A | 5/2003 |
| JP | 200583962 A | 3/2005 |
| JP | 2009270758 A | 11/2009 |

* cited by examiner

*Primary Examiner* — Atif H Chaudry
(74) *Attorney, Agent, or Firm* — Studebaker & Brackett PC

(57) ABSTRACT

A substrate processing system includes a first chamber, a second chamber, a gas control part for controlling a gas flow in at least one of the chambers, a gate which can be set in an open state to connect the first chamber and the second chamber, and which can be set in a shutoff state to shut off the first chamber and the second chamber, a first selecting device which permits setting of the gate in the open state on the basis of a recipe, and a second selecting device which permits setting of the gate in the open state only when control with the gas control part satisfies a safety condition, wherein the gate is set in the open state only when setting of the gate in the open state is permitted both by the first selecting device and by the second selecting device.

12 Claims, 12 Drawing Sheets

SUBSTRATE PROCESSING SYSTEM

BACKGROUND OF THE INVENTION

Field of the Invention

The present invention relates to a substrate processing system constituting, for example, part of a semiconductor manufacturing apparatus.

Background Art

Japanese Patent Laid-Open No. 2009-270758 discloses introducing an atmosphere gas concentrically into a heating furnace body so that the pressure in the heating furnace body is maintained higher than the pressure in a salt bath chamber. This enables avoiding corrosion of furnace members and disturbance of the atmosphere in the heating furnace caused by a gas generated from the salt bath vessel.

Japanese Patent Laid-Open No. 2005-83962 discloses an arrangement in which when a microcomputer receives a gas leak signal from a gas leak alarm, it energizes a shutoff valve by turning on a transistor. This shutoff valve is ordinarily opened/closed by means of a permanent magnet. A current is caused to flow for a moment in a direction as opposed to the direction of opening/closing by means of the permanent magnet to cancel out the magnetic force, thereby shutting off gas with spring pressure.

Japanese Patent Laid-Open No. 2003-140703 discloses an arrangement in which an interlock unit is detachably provided between an input unit and a magnet valve unit and (or) between the magnet valve unit and another adjacent magnet valve unit. Safety measures are thereby provided selectively on the desired magnetic valves and devices related to the magnetic valves.

In some cases of handling of a dangerous gas in a substrate processing system such as a semiconductor manufacturing apparatus, a gas sensor is provided in order to ensure the desired safety performance of the apparatus. An arrangement is known in which a controller receives a detection signal from a gas sensor and outputs a signal to a solenoid to control opening/closing of a gate.

A dangerous gas exists which is assigned a safety criterion at or below the detection limit of gas sensors on the market. It is necessary to prevent even a trace amount of such a dangerous gas from flowing out of a certain place into a particular chamber. Control with reference to an alarm signal from a gas sensor, however, does not ensure the desired safety performance of an apparatus using such a dangerous gas since flowing-out of a trace amount of the gas cannot be detected. It is thus difficult to secure the safety. In a case where a dangerous gas is detected with a gas sensor set in a place where flowing-in of a dangerous gas must be prevented, the dangerous gas is detected with the gas sensor only after the dangerous gas has leaked out. It cannot be said that a sufficiently high degree of security can be secured in this case. It is desirable to prevent flowing-out of the dangerous gas.

In such a situation, a gas is supplied to a first chamber not containing a dangerous gas to increase the pressure in the first chamber while gases in a second chamber adjacent to the first chamber and containing the dangerous gas are discharged to reduce the pressure in the second chamber. That is, the pressure in the second chamber is reduced relative to that in the adjacent chamber. Pressure meters are provided in the first and second chambers. A controller receives measurement results from the pressure meters, checks whether the pressure in the second chamber is sufficiently low in comparison with that in the first chamber, and opens a gate between the first and second chambers. The components can thus be arranged to manage the difference in pressure between the first and second chambers so that the dangerous gas does not move into the first chamber.

SUMMARY OF THE INVENTION

In view of the above-described problem, an object of the present invention is to provide a substrate processing system capable of securing the safety of the operation without checking the existence/nonexistence of a gas and without measuring pressures.

The features and advantages of the present invention may be summarized as follows.

According to one aspect of the present invention, a substrate processing system includes a first chamber, a second chamber provided adjacent to the first chamber, a gas control part for controlling a flow of gas in at least one of the first chamber and the second chamber, a gate which can be set in an open state to connect the interior of the first chamber and the interior of the second chamber to each other, and which can be set in a shutoff state to shut off the interior of the first chamber and the interior of the second chamber from each other, a first selecting device which permits setting of the gate in the open state on the basis of a recipe, and a second selecting device which permits setting of the gate in the open state only when control with the gas control part satisfies a safety condition under which a dangerous gas in the second chamber does not enter the first chamber while the gate is in the open state, wherein the gate is set in the open state only when setting of the gate in the open state is permitted both by the first selecting device and by the second selecting device, and the gate is set in the shutoff state in other cases.

Other and further objects, features and advantages of the invention will appear more fully from the following description.

DETAILED DESCRIPTION OF THE PREFERRED EMBODIMENTS

Figure 1:
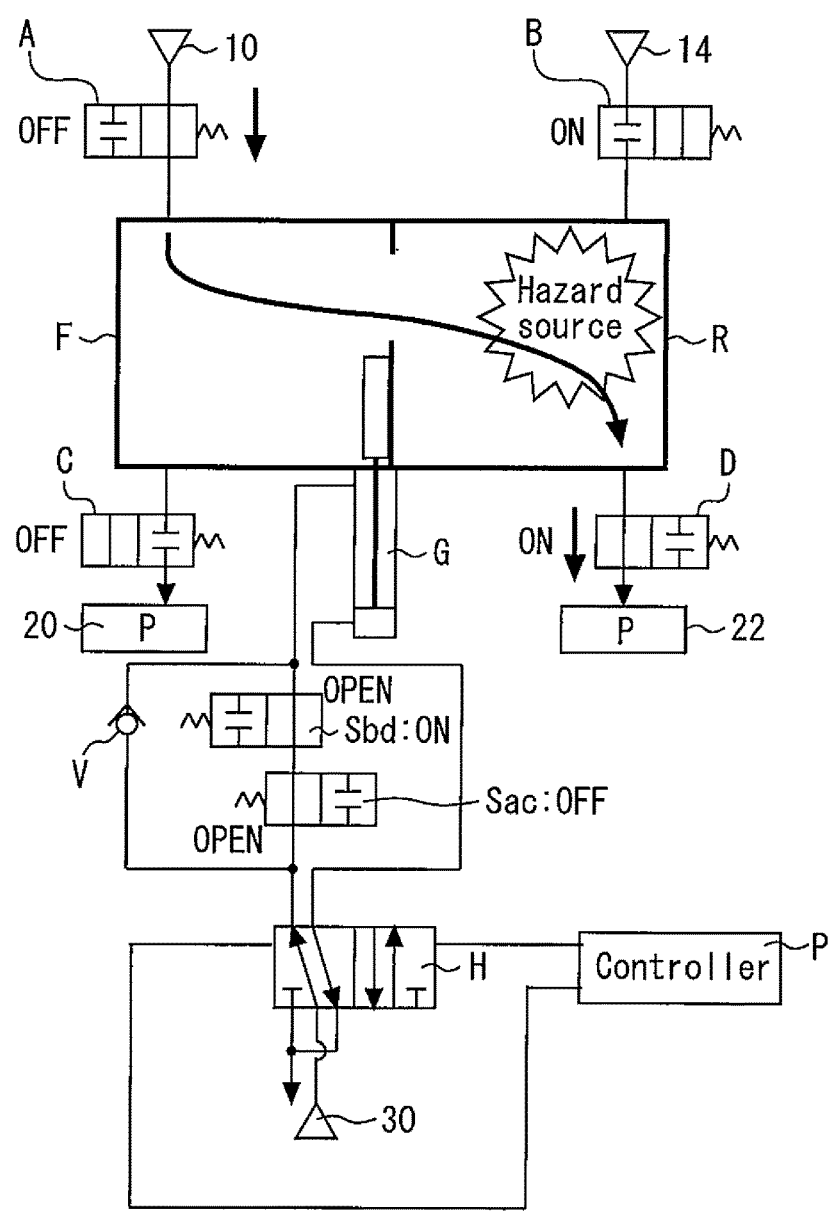
FIG. 1 is a diagram showing a configuration of a substrate processing system according to a first embodiment.

A substrate processing system according to an embodiment of the present invention will be described with reference to the accompanying drawings. Components identical or corresponding to each other are assigned the same reference characters and repeated description of them is avoided in some cases.

First Embodiment

FIG. 1 is a diagram showing a configuration of a substrate processing system according to a first embodiment of the present invention. The substrate processing system is provided with a first chamber F and a second chamber R provided adjacent to the first chamber F. For example, if the first chamber F is a wafer handling chamber (WHC), the second chamber R is a process module chamber. In a case where the first chamber F is a WHC, a substrate transport device for transporting substrates is provided in the first chamber F. If the second chamber R is a process module chamber, a substrate processing device for processing substrates is provided in the second chamber R. Different components may be adopted as the first chamber F and the second chamber R. For example, if the first chamber F is a load lock chamber, the second chamber R may be a WHC or an equipment front end module (EFEM).

A gate G driven, for example, by a pneumatic valve actuator is provided between the first chamber F and the second chamber R. FIG. 1 shows a state where the gate G is in an open state and the interior of the first chamber F and the interior of the second chamber R communicate with each other. The gate G is capable of shutting off the interior of the first chamber F and the interior of the second chamber R from each other by sliding a plate member in an upward direction as viewed in FIG. 1. This state will be referred to as "shutoff state". The gate G is a double-acting gate requiring supply of air at the time of changing from the open state into the shutoff state and at the time of changing from the shutoff state into the open state.

A gas source 10 in which a purge gas, for example, is accumulated is connected to the first chamber F. The gas in the gas source 10 can flow to the first chamber F via a first valve A. When the first valve A is opened, the gas is supplied into the first chamber F. The first valve A is a normally open valve which keeps in an open state when supplied with no signal. The first valve A shown in FIG. 1 is in the open state, with no signal supplied thereto.

A vacuum pump 20 is connected to the first chamber F. The vacuum pump 20 is for discharging gases in the first chamber F. A third valve C is provided in the discharge line. That is, the first chamber F and the vacuum pump 20 are connected to each other through the third valve C. When the third valve C is set in an open state, the gas in the first chamber F is discharged. The third valve C is a normally closed valve which is set in a closed state when supplied with no signal. The third valve C shown in FIG. 1 is in the closed state, with no signal supplied thereto.

A gas source 14 in which a material gas, for example, is accumulated is connected to the second chamber R. The gas in the gas source 14 can flow to the second chamber R via a second valve B. When the second valve B is set in an open state, the gas is supplied into the second chamber R. The second valve B is a normally open valve which keeps in the open state when supplied with no signal. The second valve B shown in FIG. 1 is in a closed state, with a signal supplied thereto. The gas source 14 in the first embodiment is a dangerous source which supplies a toxic gas, e.g., arsine to the second chamber R through the second valve B.

A vacuum pump 22 is connected to the second chamber R. The vacuum pump 22 is for discharging gases in the second chamber R. A fourth valve D is provided in the discharge line. That is, the second chamber R and the vacuum pump 22 are connected to each other through the fourth valve D. When the fourth valve D is set in an open state, the gas in the second chamber R is discharged. The fourth valve D is a normally closed valve which is in a closed state when supplied with no signal. The fourth valve D shown in FIG. 1 is in the open state, with a signal supplied thereto. The vacuum pumps 20 and 22 may be integrated with each other.

The first to fourth valves A, B, C, and D are a "gas control part" with which the flows of gases in the first chamber F or the second chamber R are controlled. The flows of gases in the first chamber F and the second chamber R are determined by the state of control with the gas control part constituted by the first to fourth valves A, B, C, and D.

Safety Condition

As a result of control with the above-described gas control part, a situation where the dangerous gas (hazard source) in the second chamber R enters the first chamber F and a situation where such entering can be inhibited occur. A condition (a state of control) in control with the gas control part under which the dangerous gas in the second chamber R does not enter the first chamber F when the gate G is in the open state will be referred to as "safety condition". More specifically, the safety condition in the first embodiment is a condition in which the first valve A and the fourth valve D are in the open state while the second valve B and the third valve C are in the closed state.

Drive of the gate G will subsequently be described. An air supply source 30 is a component for supplying a gas used to open/close the gate G. The air supply source 30 is connected to the gate G through a solenoid H, a first solenoid Sac and a second solenoid Sbd. Therefore, supplying the gas from the air supply source 30 to the gate G to open the gate G requires that all the solenoid H, first solenoid Sac and second solenoid Sbd be in open states.

A check valve V is connected in parallel with the first solenoid Sac and the second solenoid Sbd. The check valve V is provided to supply a passage through which air is caused to flow from the gate G to the solenoid H without flowing via the first solenoid Sac and the second solenoid Sbd.

Each of the solenoid H, the first solenoid Sac and the second solenoid Sbd converts electrical energy into a mechanical motion by using magnetic force produced by causing a current to flow through an electromagnetic coil. Each of the solenoid H, the first solenoid Sac and the second solenoid Sbd opens or closes the valve by the mechanical motion to open or close the air passage.

The solenoid H is connected to a controller P constituted by a computer for example. The controller P includes a unit for transporting and processing substrates on the basis of a recipe including a recorded sequence of opening and closing various valves and the gate G and recorded details of substrate processing, which unit is called a module controller. The controller P controls the opening/closing of the solenoid H on the basis of the recipe in which details of transport and processing of substrates are described. That is, the controller P sets the solenoid H in the open state when the gate G is to be opened on the basis of the recipe, and sets the solenoid H in a closed state when the gate G is to be closed on the basis of the recipe. Thus, the solenoid H permits setting of the gate G in the open state on the basis of the recipe.

Figure 2:
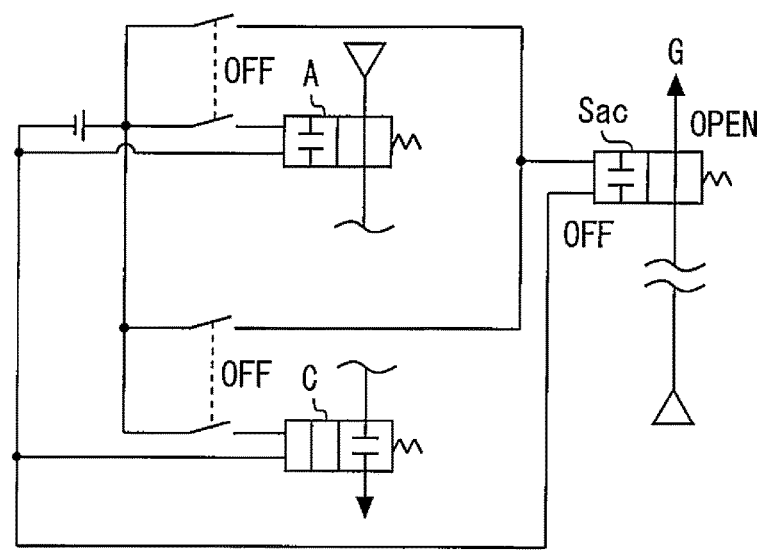
FIG. 2 shows a connection relationship between the first solenoid and the first and third valves.

The first solenoid Sac senses electrical signals from the first valve A and the third valve C. Opening/closing of the first solenoid Sac is controlled on the basis of these electrical signals. FIG. 2 shows a connection relationship between the first solenoid Sac and the first and third valves A and C. Satisfying the safety condition under which the dangerous gas does not enter the first chamber F requires that the first valve A be off (i.e., in the open state) and the third valve C be off (i.e., in the closed state). The first solenoid Sac is a normally open solenoid such that it is in the open state when both the first and third valves A and C are off. To realize this, a parallel circuit in which on/off signals for the first and third valves A and C and an on/off signal for the first solenoid Sac are linked, for example, by a double-pole single-throw switch is formed, as shown in FIG. 2. Thus, the first solenoid Sac is constructed so as to be in the open state when the first valve A and the third valve C meet the safety condition.

Figure 3:
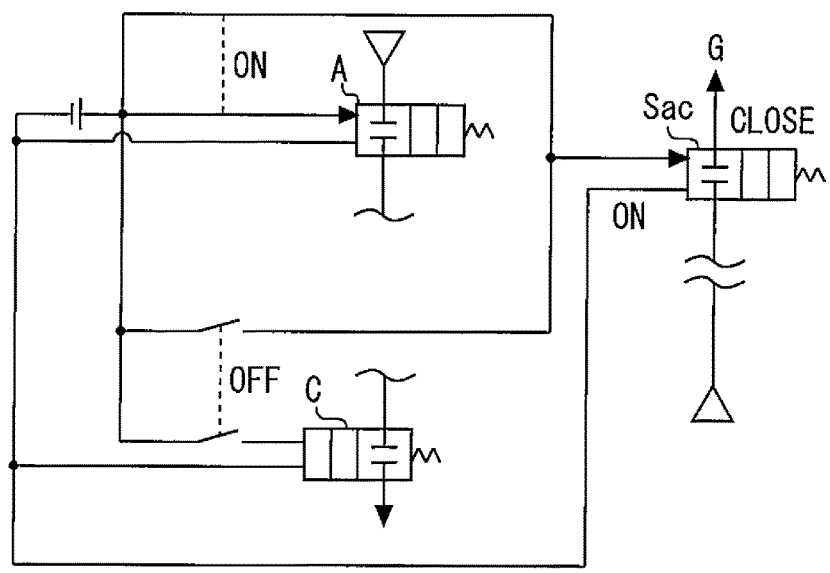
FIG. 3 is a diagram showing setting of the first solenoid in the closed state.

FIG. 3 is a diagram showing setting of the first solenoid Sac in the closed state. The first solenoid Sac is closed when failure to satisfy the safety condition occurs as a result of turning-on (i.e., setting in the closed state) of the first valve A or turning-on (i.e., setting in the open state) of the third valve C. FIG. 3 shows a state where the first solenoid Sac is closed because of failure to satisfy the safety condition as a result of turning-on (i.e., setting in the closed state) of the first valve A while the third valve C is off (i.e., in the closed state). That is, the first solenoid Sac cannot be opened unless the first valve A and the third valve C meet the safety condition.

Figure 4:
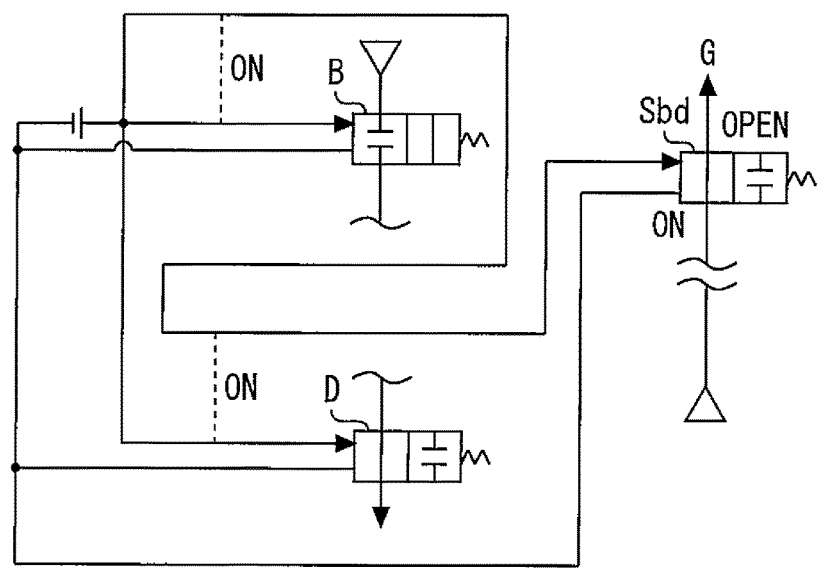
FIG. 4 shows a connection relationship between the second solenoid and the second and fourth valves.

The second solenoid Sbd senses electrical signals from the second valve B and the fourth valve D. Opening/closing of the second solenoid Sbd is controlled on the basis of these electrical signals. FIG. 4 shows a connection relationship between the second solenoid Sbd and the second and fourth valves B and D. Satisfying the safety condition under which the dangerous gas does not enter the first chamber F requires that the second valve B be on (i.e., in the closed state) and the fourth valve D be on (i.e., in the open state). The second solenoid Sbd is a normally closed solenoid such that it is in the open state when both the second and fourth valves B and D are on. To realize this, a parallel circuit in which on/off signals for the second and fourth valves B and D and an on/off signal for the second solenoid Sbd are linked, for example, by a double-pole single-throw switch is formed, as shown in FIG. 4. Thus, the second solenoid Sbd is constructed so as to be in the open state when the second valve B and the fourth valve D meet the safety condition.

Figure 5:
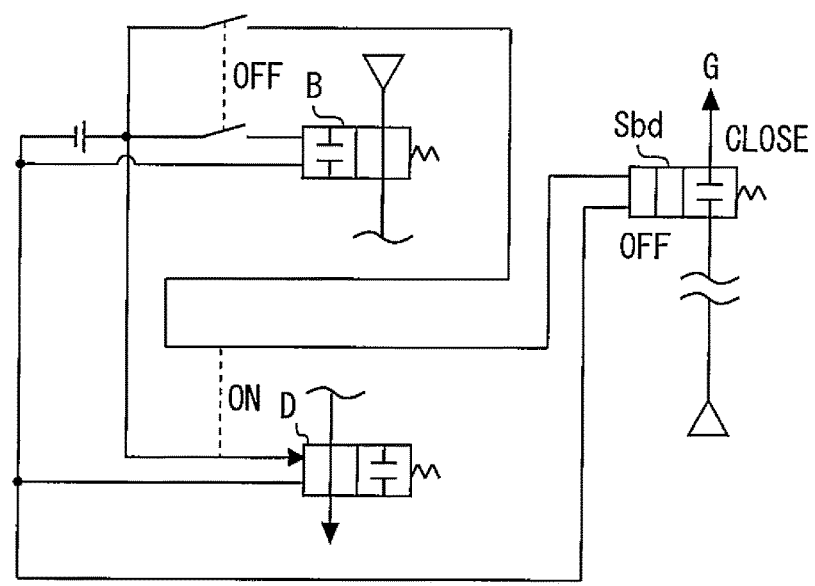
FIG. 5 is a diagram showing setting of the second solenoid in the closed state.

FIG. 5 is a diagram showing setting of the second solenoid Sbd in the closed state. The second solenoid Sbd is closed when failure to satisfy the safety condition occurs as a result of turning-off (i.e., setting in open state) of the second valve B or turning-off (i.e., setting in closed state) of the fourth valve D. FIG. 5 shows a state where the second solenoid Sbd is closed because of failure to satisfy the safety condition as a result of turning-off (i.e., setting in the open state) of the second valve B and/or the fourth valve D. That is, the second solenoid Sbd cannot be opened unless the second valve B and the fourth valve D meet the safety condition.

Description will be made by referring again to FIG. 1. FIG. 1 shows a state where the controller P sets the solenoid H in the open state on the basis of the recipe; the first and third valves A and C meet the safety condition; and therefore the first solenoid Sac is set in the open state, and where the second and fourth valves B and D meet the safety condition and therefore the second solenoid Sbd is set in the open state. Only after all the solenoid H, the first solenoid Sac and the second solenoid Sbd are set in the open state, air can be supplied with from the air supply source 30 to the gate G to open the gate G. Therefore, the gate G cannot be opened if the first solenoid Sac or the second solenoid Sbd is in the closed state even while the solenoid H is in the open state.

Figure 6:
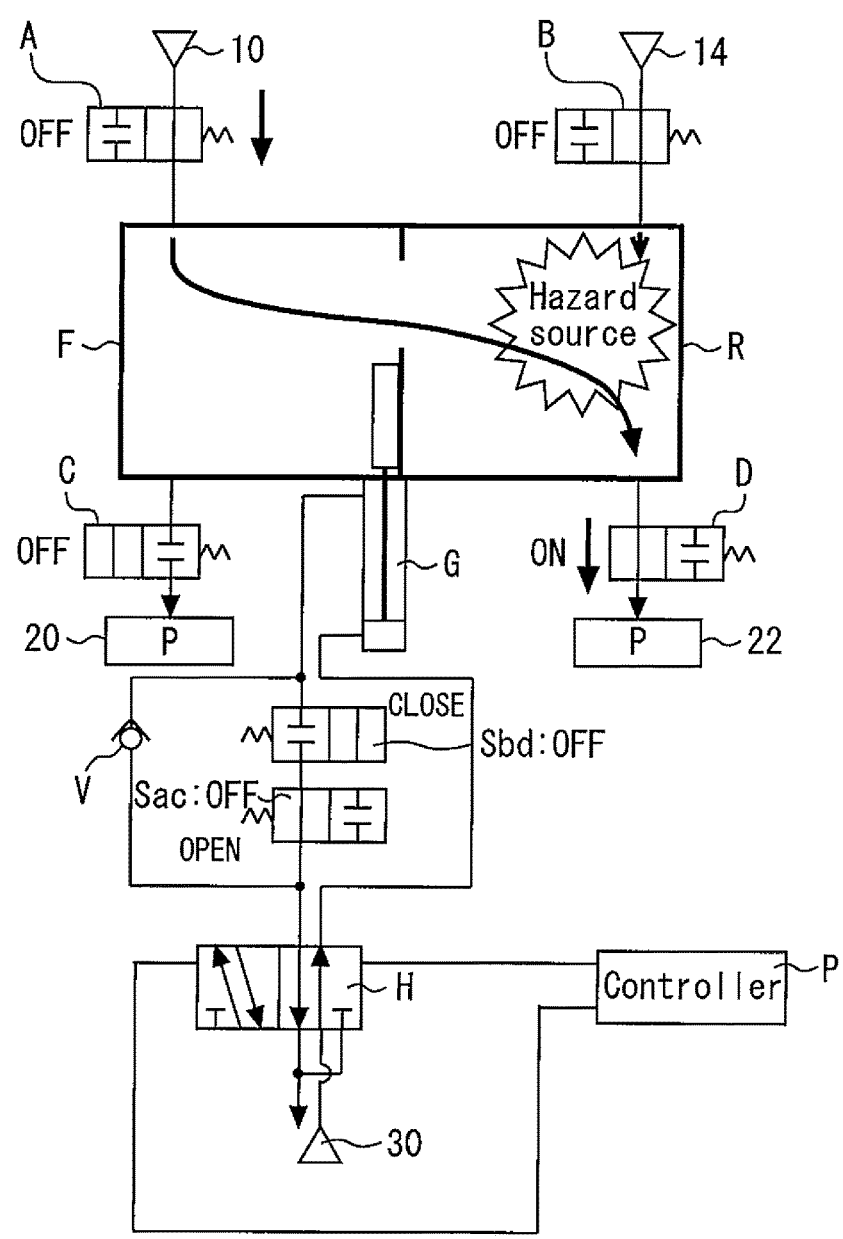
FIG. 6 is a diagram for explaining the operation of the substrate processing system.

FIG. 6 is a diagram for explaining the operation of the substrate processing system when failure to satisfy the safety condition occurs while the gate G is in open (in the open state). When failure to satisfy the safety condition occurs while the gate is open, there is a need to immediately set the gate G in the shutoff state. For example, when failure to satisfy the safety condition occurs as a result of turning-off (setting in the open state) of the second valve B, the second solenoid valve Sbd is closed, as shown in FIG. 6. Since the dangerous gas is supplied into the second chamber R when the second valve B is opened, the controller P sets the solenoid H in the closed state on the basis of the recipe. Air for closing the gate G is then supplied to the gate G through the check valve V, thereby closing the gate G.

Figure 7:
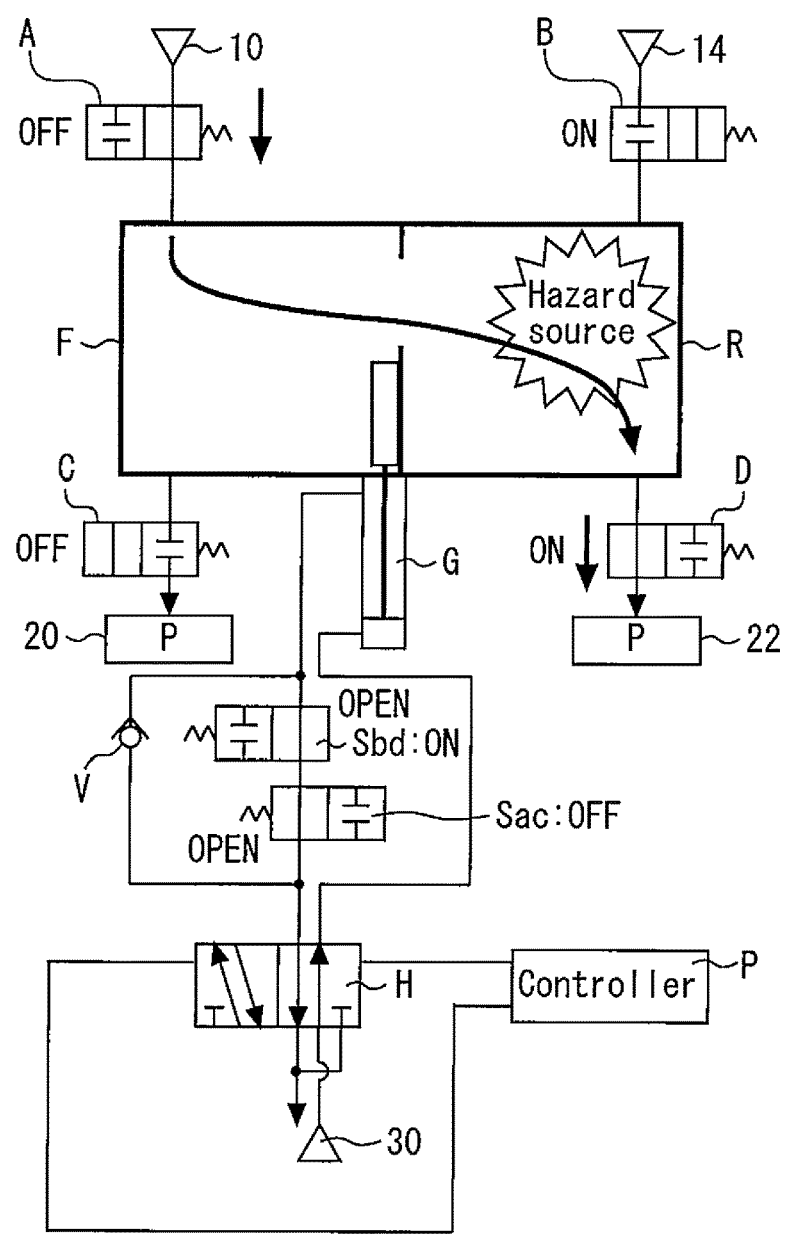
FIG. 7 is a diagram for explaining the operation of the substrate processing system.

FIG. 7 is a diagram for explaining the operation of the substrate processing system when the solenoid H is set in the closed state while the gate G is open. When the solenoid H is set in the closed state while the gate G is in the open state, air is supplied to the gate G to close the gate G.

In the substrate processing system according to the first embodiment of the present invention, even when setting the gate G in the open state with the solenoid H is permitted on the basis of the recipe, the first solenoid Sac or the second solenoid Sbd is closed if the first to fourth valves A, B, C, and D constituting the gas control part do not satisfy the safety condition, thus enabling prevention of opening of the gate G. That is, the gate G is set in the open state only when setting the gate G in the open state is permitted both by the solenoid H and by the first and second solenoids Sac and Sbd, and the gate G is set in the shutoff state in other cases.

The above-described gate opening/closing means requires neither detection of a markedly trace amount of dangerous gas with a gas sensor nor management of the difference in pressure between the first and second chambers F and R. Also, the operations of the first and second solenoids Sac and Sbd are linked with the electrical signals for controlling opening/closing of the first valve A, the second valve B, the third valve C and the fourth valve D. The substrate processing system therefore has a markedly simple configuration. The substrate processing system according to the first embodiment can thus be provided as a substrate processing system having a simple configuration and high safety performance.

The gas control part is not limited to the first to fourth valves A, B, C, and D. Any gas control part suffices if it is capable of controlling the gas flow in at least one of the first chamber F and the second chamber R. The gate G is not limited to the pneumatically opened/closed type. For example, the gate G may alternatively be a hydraulically opened/closed type. The number of chambers is not particularly specified if a plural number of chambers are provided.

The present invention is effective in a case where a dangerous gas exists or there is a possibility of existence of a dangerous gas in at least one of a plurality of chambers.

The "safety condition" can be changed as desired according to the configuration of the gas control part. In the first embodiment, the solenoid H is adopted as the first selecting device which permits setting of the gate G in the open state on the basis of a recipe, and the first solenoid Sac and the second solenoid Sb are adopted as the second selecting device which permits setting of the gate G in the open state only when the gas control part satisfies the safety condition. However, a component other than the solenoid H may be adopted as the first selecting device and a component other than the first and second solenoids Sac and Sbd may be adopted as the second selecting device. Also, while the first selecting device (solenoid H) is connected to the air supply source 30 and the second selecting device (first solenoid Sac and second solenoid Sbd) are connected between the first selecting device and the gate G, different connections may be made.

These modifications can be applied as desired to substrate processing systems according to embodiments described below. The substrate processing systems according to the embodiments described below have a number of commonalities with the first embodiment and will therefore be described mainly with respect to points of difference from the first embodiment.

Second Embodiment

Figure 8:
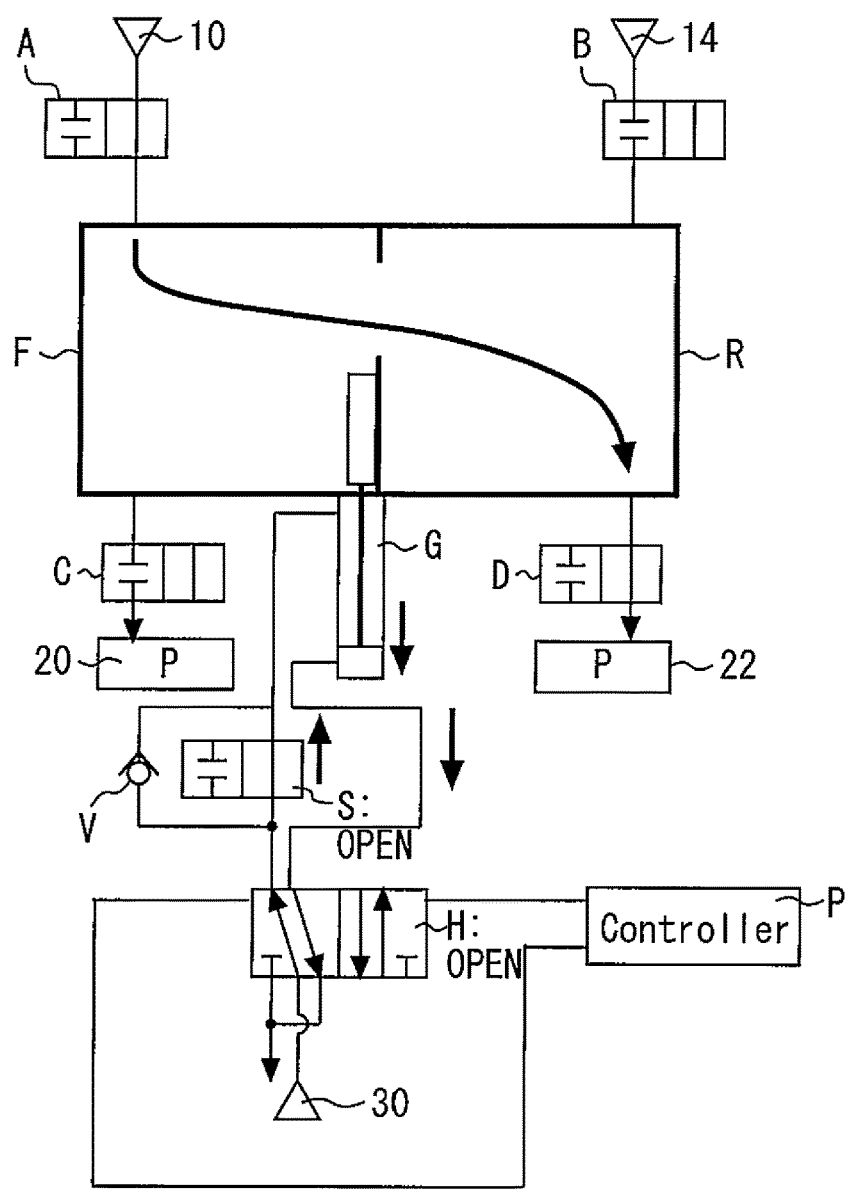
FIG. 8 is a diagram showing a configuration of the substrate processing system according to the second embodiment.

FIG. 8 is a diagram showing a configuration of the substrate processing system according to the second embodiment of the present invention. The substrate processing system according to the second embodiment is provided with a solenoid S. The solenoid S is, for example, the first solenoid Sac or the second solenoid Sbd described in the description of the first embodiment. That is, in the second embodiment, a gas control part is constituted by two valves. If the solenoid S is of the same construction as the second solenoid Sbd, a safety condition can be identified only from the state of control with the second valve B and the fourth valve D.

Thus, a "safety condition" which is a condition under which a dangerous gas in the second chamber R does not enter the first chamber F can be prescribed with any gas control part. A component other than the valve may be selected as a gas control part. For example, a vacuum pump or a mass flow controller can be selected as a gas control part.

Third Embodiment

Figure 9:
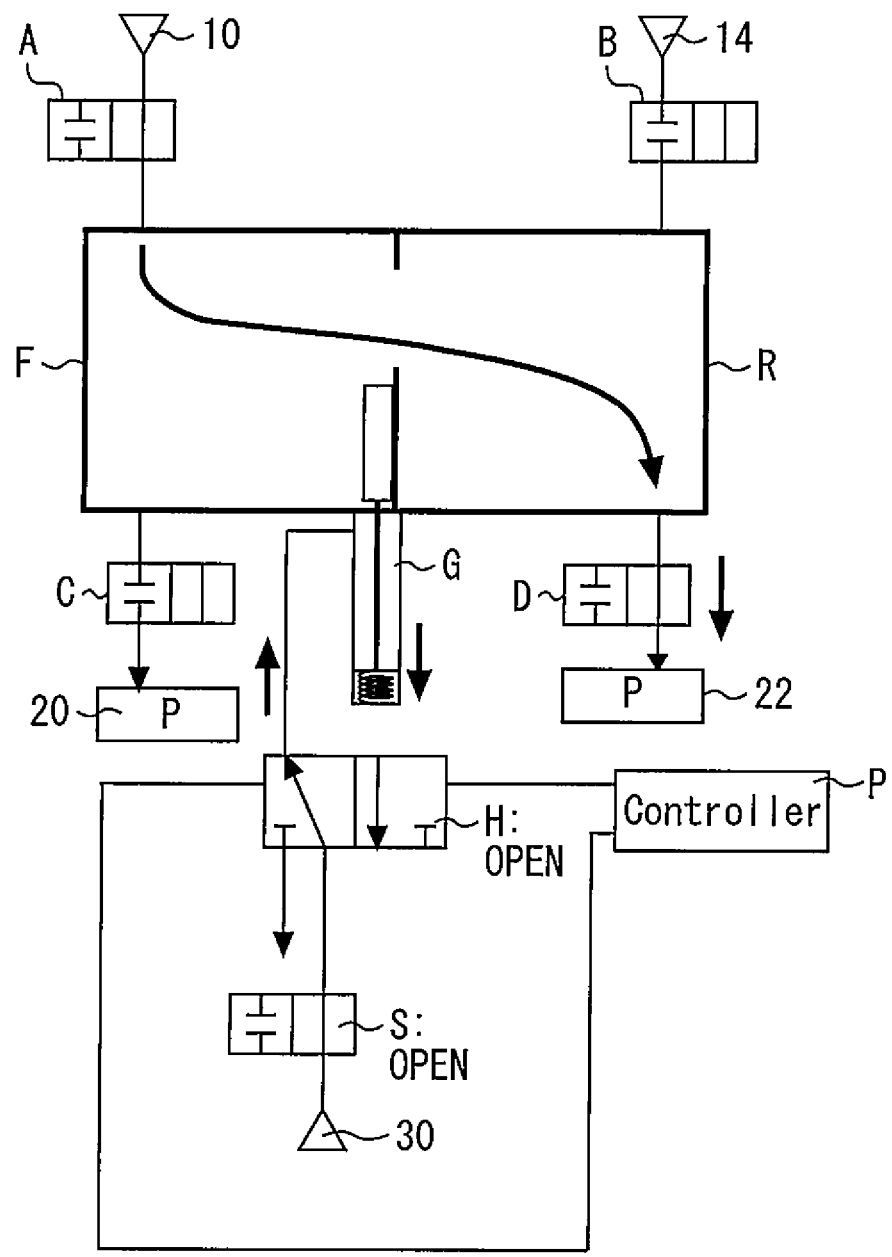
FIG. 9 is a diagram showing a configuration of the substrate processing system according to the third embodiment.

FIG. 9 is a diagram showing a configuration of the substrate processing system according to the third embodiment of the present invention. The gate G according to the third embodiment is a single-acting gate which requires supply of air when changed from a shutoff state into an open state, which is changed from the open state into the shutoff state by drawing out air. The single-acting gate incorporates a spring. The solenoid S formed as the second selecting device is connected to the air supply source 30, while the solenoid H as the first selecting device is connected between the second selecting device (solenoid S) and the gate G. That is, the solenoid S is provided on the upstream side of the solenoid H as seen from the air supply source 30. The solenoid S shown in FIG. 9 is expressed as one solenoid representing the first solenoid Sac and the second solenoid Sbd in the first embodiment for convenience sake.

Figure 10:
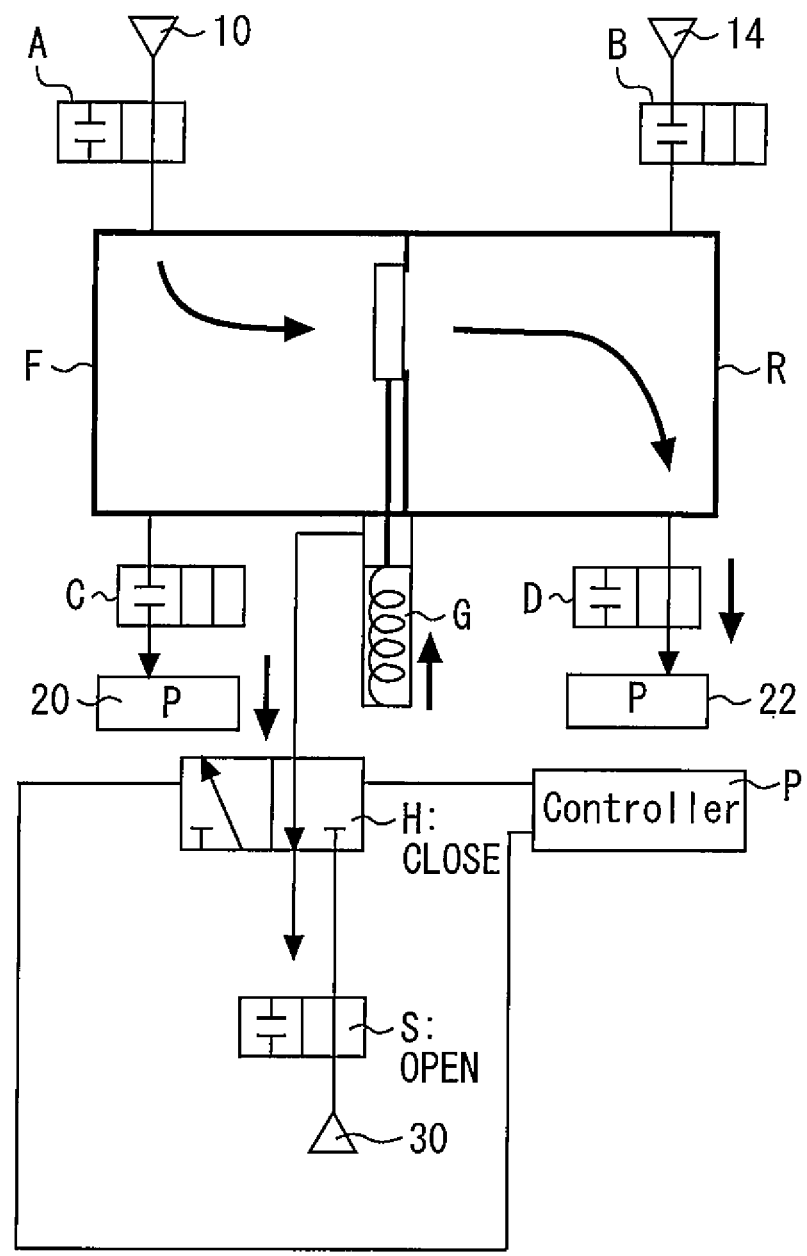
FIG. 10 is a diagram showing a state where the gate is closed.

FIG. 9 shows a state where the safety condition is satisfied; the solenoid S is therefore set in the open state; the solenoid H is set in the open state; and the gate is therefore opened. If the solenoid H is set in the closed state in this situation, the gate G is closed by the spring force of the gate G. FIG. 10 is a diagram showing a state where the gate G is closed as a result of setting the solenoid H in the closed state.

Figure 11:
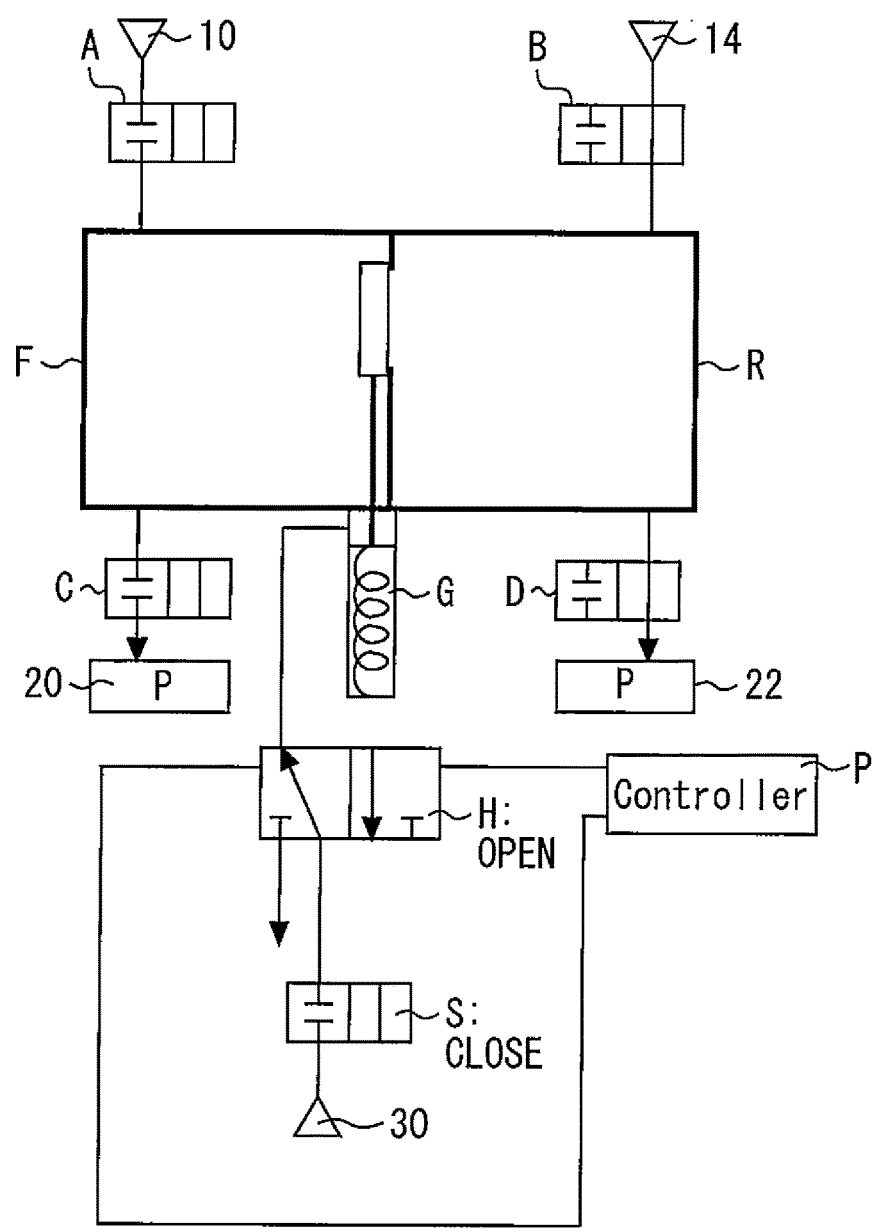
FIG. 11 is a diagram showing a situation where the gate is closed.

FIG. 11 is a diagram showing a situation where even when the solenoid H is set in the open state while the gate G is in the shutoff state, the gate G is not opened if the solenoid S is not set in the open state. Prevention of opening of the gate G when the safety condition is not satisfied is thus enabled.

Figure 12:
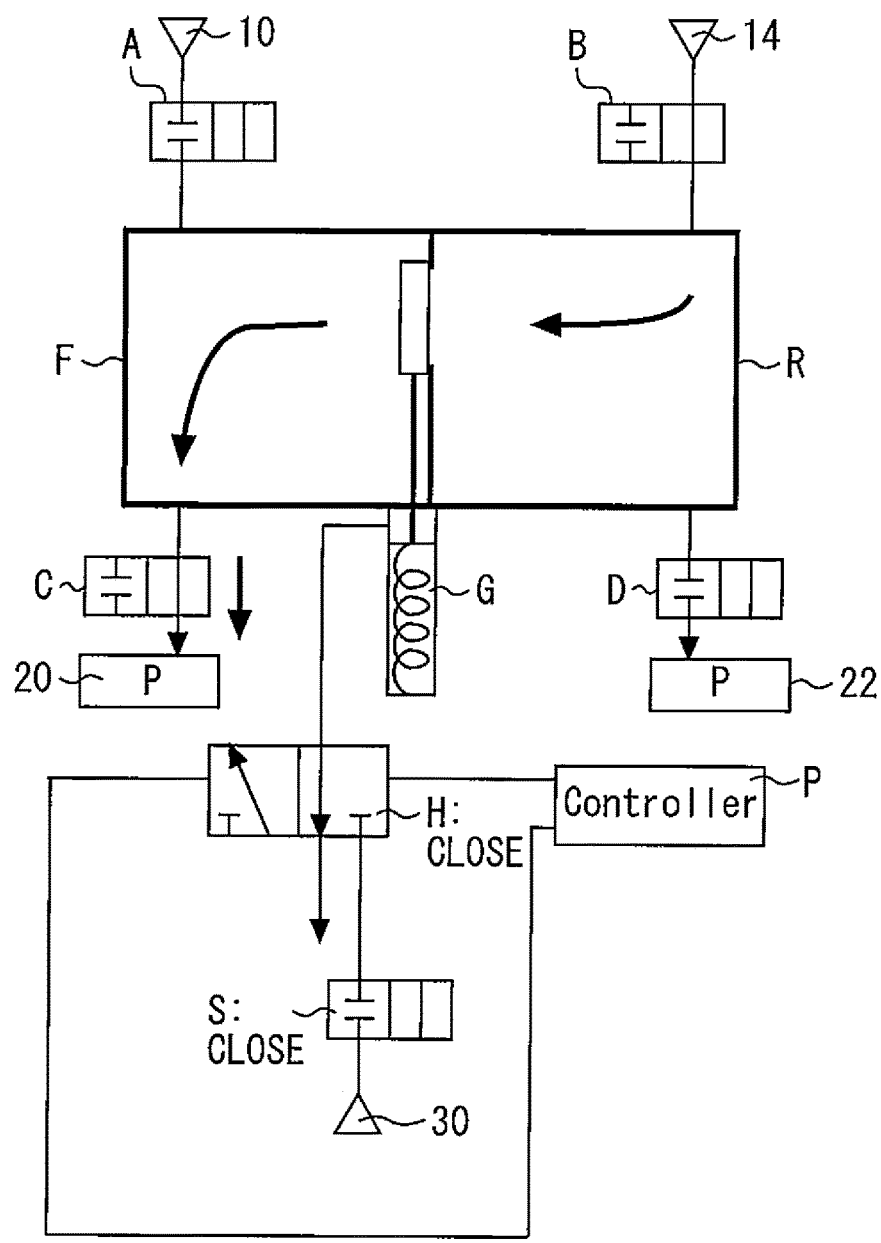
FIG. 12 is a diagram showing the operation when failure to satisfy the safety condition occurs while the gate is in the open state.

FIG. 12 is a diagram showing the operation when failure to satisfy the safety condition occurs while the gate G is in the open state. When failure to satisfy the safety condition occurs, the solenoid S is set in the closed state. When the solenoid H is set in the closed state, the gate G is closed by the spring force of the gate G.

Thus, even in a case where a single-acting gate is adopted as the gate G, a substrate processing system having high safety performance can be provided as with the first embodiment.

Fourth Embodiment

Figure 13:
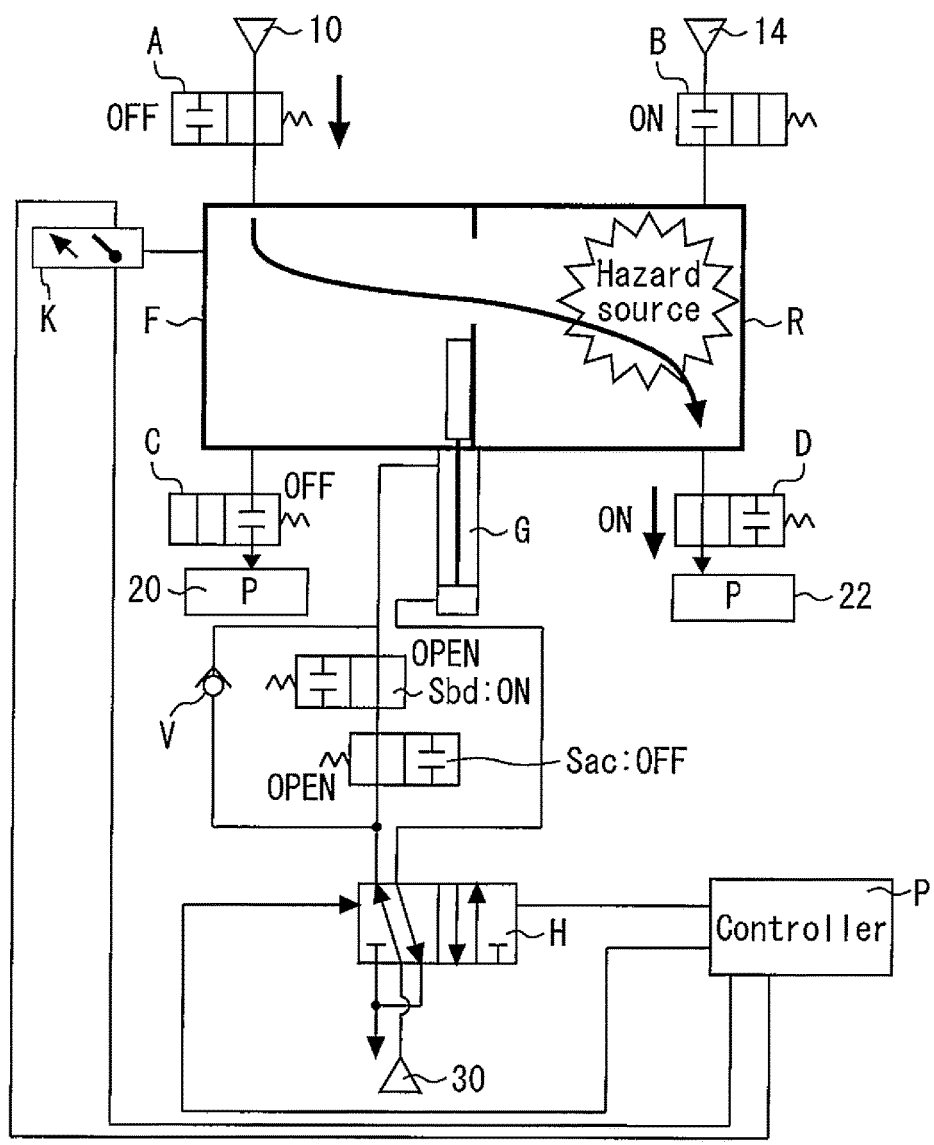
FIG. 13 is a diagram showing a configuration of the substrate processing system according to the fourth embodiment of the present invention.

FIG. 13 is a diagram showing a configuration of the substrate processing system according to the fourth embodiment of the present invention. This substrate processing system is formed by adding a safety circuit with a gas sensor to the substrate processing system in the first embodiment. A gas sensor K is attached to the first chamber F. The gas sensor K is a sensor for detecting the gas concentration in the first chamber F. The gas sensor K is connected to the controller P. Accordingly, the controller P is connected to the gas sensor K and to the solenoid H formed as the first selecting device.

The controller P receives a detection result from the gas sensor K and determines whether the gas concentration in the first chamber F is equal to or lower than a reference value. The controller P sets the solenoid H in the open state when gate G should be in the open state according to a recipe, and the gas concentration in the first chamber F is equal to or lower than the reference value. In other words, the solenoid H as the first selecting device permits setting of the gate G in the open state when the gate G is set in the open state on the basis of the recipe and the controller P simultaneously determines that the gas concentration in the first chamber F is equal to or lower than the reference value. On the other hand, when the gate G is to be closed according to the processing sequence described in the recipe, or when the gas concentration in the first chamber F is higher than the reference value, the controller P sets the solenoid H in the closed state.

Accordingly, in the substrate processing system according to the fourth embodiment of the present invention, the gate G can be set in the open state only after a check is made to determine that the dangerous gas does not exist in the first chamber from the result of detection with the gas sensor K while opening of the gate G is prescribed on the recipe and the safety condition is satisfied. A substrate processing system having a double safety circuit having a safety circuit including the solenoid S and a safety circuit including the gas sensor K can thus be provided.

Even when the gas sensor K malfunctions, the operations of the first solenoid Sac and the second solenoid Sbd are not influenced. In this case, when failure to satisfy the safety condition occurs, the first solenoid Sac or the second solenoid Sbd is set in the closed state and the controller P sets the solenoid H in the closed state. Therefore, the gate G can be rapidly closed. On the other hand, even when the first solenoid Sac or the second solenoid Sbd malfunctions, the operation of the gas sensor K is not influenced. That is, even in a situation where the first solenoid Sac or the second solenoid Sbd malfunctions in the open state, the gate G can be closed if the solenoid H is set in the closed state. In a situation where the first solenoid Sac or the second solenoid Sbd malfunctions in the closed state, the gate G must be in the closed state and flowing of the dangerous gas into the first chamber F can therefore be inhibited. Consequently, even when either of the gas sensor K and the first solenoid Sac or the second solenoid Sbd malfunctions, the safety circuit not including the malfunctioning part functions to continue securing the safety of the apparatus.

Needless to say, the double safety circuit having the safety circuit including the solenoid S and the safety circuit including the gas sensor K can also be used in the case where the gate G is of the single-acting type.

Fifth Embodiment

Figure 14:
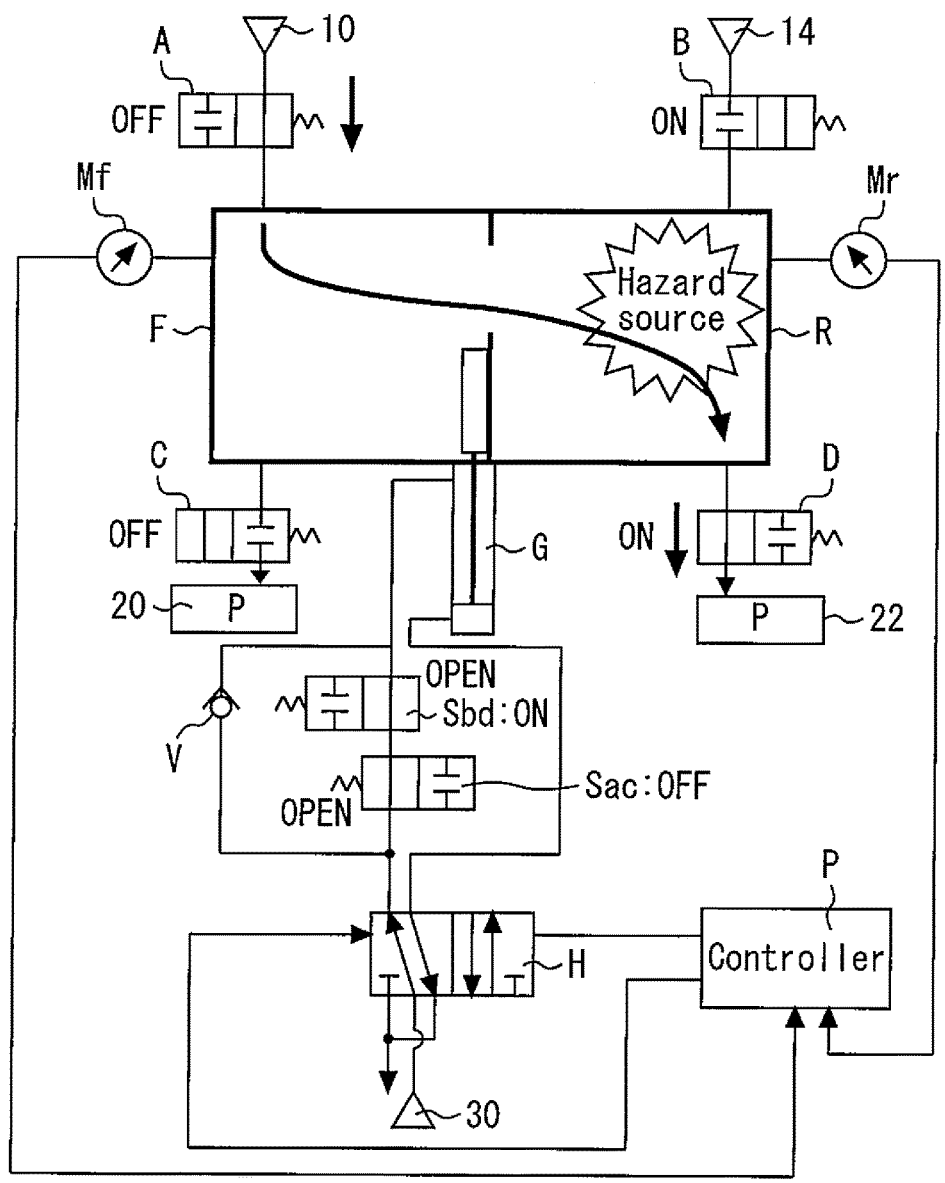
FIG. 14 is a diagram showing a configuration of the substrate processing system according to the fifth embodiment.

FIG. 14 is a diagram showing a configuration of the substrate processing system according to the fifth embodiment of the present invention. This substrate processing system is formed by adding a safety circuit with pressure gages Mf and Mr to the substrate processing system in the first embodiment. With the pressure gages Mf and Mr, the pressure in the first chamber F and the pressure in the second chamber R are respectively measured. The pressure gages Mf and Mr are connected to the controller P. The controller P is connected to the pressure gages Mf and Mr and to the solenoid H formed as the first selecting device.

The controller P receives the results of detection with the pressure gages Mf and Mr and determines whether or not the pressure in the first chamber F is higher by a predetermined value than the pressure in the second chamber R, for example, by computing the difference in pressure between the two detection results. If the gate G is to be set in the open state according to a recipe, and if the pressure in the first chamber F is higher by the predetermined value than the pressure in the second chamber R, the controller P sets the solenoid H in the open state. In other words, the solenoid H as the first selecting device permits setting of the gate G in the open state when the gate G is to be set in the open state according to the recipe and the controller P simultaneously determines that the pressure in the first chamber F and the pressure in the second chamber R are within a predetermined range. On the other hand, the controller P sets the solenoid H in the closed state when the gate G is to be closed according to the processing sequence described in the recipe, or when the pressure in the first chamber F and the pressure in the second chamber R are not within the predetermined range (the pressure in the first chamber F is not higher by the predetermined value than the pressure in the second chamber R).

Accordingly, in the substrate processing system according to the fifth embodiment of the present invention, the gate G can be set in the open state only after a check is made to determine that the pressure difference is at such a value that the dangerous gas does not move from the second chamber R into the first chamber F from the results of detection with the pressure gages Mf and Mr while opening of the gate G is prescribed on the recipe and the safety condition is satisfied. A substrate processing system having a double safety circuit having a safety circuit including the first solenoid Sac and the second solenoid Sbd and a safety circuit including the pressure gages Mf and Mr can thus be provided.

Even when any of the pressure gages Mf and Mr malfunctions, the operations of the first solenoid Sac and the second solenoid Sbd are not influenced. On the other hand, even when the first solenoid Sac or the second solenoid Sbd malfunctions, the operations of the pressure gages Mf and Mr are not influenced. Consequently, even when either of the pressure gage Mf or Mr and the first solenoid Sac or the second solenoid Sbd malfunctions, the safety circuit not including the malfunctioning part functions to continue securing the safety of the apparatus. A circuit having improved safety performance can thus be provided. Details of the operation are the same as those concretely described in the description of the fourth embodiment.

Needless to say, the double safety circuit having the safety circuit including the solenoid S and the safety circuit including the pressure gages Mf and Mr can also be used in the case where the gate G is of the single-acting type.

As described above, the substrate processing system according to the present invention has, at an intermediate position in the pneumatic or hydraulic circuit for driving the gate G, at least one solenoid which opens the circuit only when the safety condition under which the dangerous gas does not move into the first chamber F is satisfied. Accordingly, a substrate processing system having features described below can be realized.

1. In a situation where the safety condition is not satisfied, the gate G is not opened even when the opening signal is issued to the solenoid H with which opening/closing of the gate G is controlled.

2. When failure to satisfy the safety condition occurs while the gate G is open, the gate G is closed if the closing signal is issued to the solenoid H with which opening/closing of the gate G is controlled.

A suitable combination of the features of the substrate processing systems according to the embodiments described above may be made and utilized.

According to the present invention, the gate that shuts off the chambers from each other is opened and closed on the basis of the operation of a gas control part, e.g., a valve. The provision of the substrate processing system having high safety performance is thus enabled.

Obviously many modifications and variations of the present invention are possible in the light of the above teachings. It is therefore to be understood that within the scope of the appended claims the invention may be practiced otherwise than as specifically described.

What is claimed is:

1. A substrate processing system comprising:
   a first chamber;
   a second chamber provided adjacent to the first chamber;
   a gas control part configured to control a flow of gas in at least one of the first chamber and the second chamber;
   a gate which can be configured to be set in a gate open state to connect the interior of the first chamber and the interior of the second chamber to each other, and which can be configured to be set in a shutoff state to shut off the interior of the first chamber and the interior of the second chamber from each other;
   a first selecting device configured to permit setting of the gate in the gate open state on the basis of a recipe; and
   a second selecting device configured to permit setting of the gate in the gate open state only when control with the gas control part satisfies a safety condition under which a dangerous gas in the second chamber cannot enter the first chamber in the gate open state, wherein the gate is set in the gate open state only when setting of the gate in the gate open state is permitted both by the first selecting device and by the second selecting device, and the gate is set in the shutoff state in other cases.

2. The substrate processing system according to claim 1, wherein the gas control part includes:
   a first valve configured to supply gas into the first chamber when the first valve is set in an open state;
   a second valve configured to supply gas to the second chamber when the second valve is set in an open state;
   a third valve configured to discharge the gas in the first chamber when the third valve is set in an open state; and
   a fourth valve configured to discharge the gas in the second chamber when the fourth valve is set in an open state,
   wherein the safety condition is a condition in which the first valve and the fourth valve are in the open state and the second valve and the third valve are in the closed state.

3. The substrate processing system according to claim 2, further comprising:
   a source configured to supply the dangerous gas connected to the first chamber through the second valve; and
   a vacuum pump connected to the first chamber through the third valve and connected to the second chamber through the fourth valve.

4. The substrate processing system according to claim 2, wherein the gate is configured to be pneumatically or hydraulically opened and closed;
   each of the first selecting device and the second selecting device is formed of a solenoid;
   opening and closing of the first valve, the second valve, the third valve and the fourth valve are controlled by means of electrical signals; and
   the operation of the second selecting device is linked with the electrical signals.

5. The substrate processing system according to claim 4, wherein the second selecting device includes:
   a first solenoid configured to sense electrical signals from the first valve and the third valve; and
   a second solenoid configured to sense electrical signals from the second valve and the fourth valve.

6. The substrate processing system according to claim 1, further comprising:
   a gas sensor configured to detect a concentration of gas in the first chamber; and
   a controller which is connected to the gas sensor and to the first selecting device, and configured to determine whether the gas concentration in the first chamber is equal to or lower than a reference value,
   wherein the first selecting device is configured to permit setting of the gate in the gate open state when the gate is to be set in the gate open state on the basis of the recipe and the controller simultaneously determines that the gas concentration in the first chamber is equal to or lower than the reference value.

7. The substrate processing system according to claim 1, further comprising:
   pressure gages configured to measure pressure in the first chamber and the pressure in the second chamber; and
   a controller connected to the pressure gages and to the first selecting device,
   wherein the first selecting device is configured to permit setting of the gate in the gate open state when the gate is to be set in the gate open state on the basis of the recipe and the controller simultaneously determines that the pressure in the first chamber and the pressure in the second chamber are in a predetermined range.

8. The substrate processing system according to claim 1, further comprising:
   a substrate transport device configured to transport a substrate provided in the first chamber; and
   a substrate processing device configured to press a substrate provided in the second chamber.

9. The substrate processing system according to claim 1, wherein the gate is configured to be pneumatically or hydraulically opened and closed; and
   each of the first selecting device and the second selecting device is formed of a solenoid.

10. The substrate processing system according to claim 1, further comprising an air supply source,
    wherein the gate is a double-acting type configured to require supply of air when changed from the gate open state into the shutoff state and when changed from the shutoff state into the gate open state;
    the first selecting device is connected to the air supply source; and
    the second selecting device is connected between the first selecting device and the gate.

11. The substrate processing system according to claim 10, further comprising a check valve connected in parallel with the second selecting device.

12. The substrate processing system according to claim 1, further comprising an air supply source,
    wherein the gate is a single-acting type configured to require supply of air when changed from the shutoff state into the gate open state, and to be changed from the gate open state into the shutoff state by drawing out air;
    the second selecting device is connected to the air supply source; and
    the first selecting device is connected between the second selecting device and the gate.

* * * * *